United States Patent
D'Souza et al.

(10) Patent No.: US 9,692,364 B2
(45) Date of Patent: Jun. 27, 2017

(54) MULTI-STAGE TRACK-AND-HOLD AMPLIFIER

(71) Applicant: SEMTECH CORPORATION, Camarillo, CA (US)

(72) Inventors: Sandeep Louis D'Souza, San Diego, CA (US); Kenneth Colin Dyer, Pleasanton, CA (US); Raghava Manas Bachu, Los Angeles, CA (US)

(73) Assignee: SEMTECH CORPORATION, Camarillo, CA (US)

( * ) Notice: Subject to any disclaimer, the term of this patent is extended or adjusted under 35 U.S.C. 154(b) by 0 days.

(21) Appl. No.: 15/092,215

(22) Filed: Apr. 6, 2016

(65) Prior Publication Data

US 2016/0218685 A1    Jul. 28, 2016

Related U.S. Application Data

(63) Continuation of application No. 14/179,503, filed on Feb. 12, 2014, now Pat. No. 9,337,785.

(51) Int. Cl.
  *H03F 3/14*    (2006.01)
  *H03F 3/16*    (2006.01)
  *G11C 27/02*   (2006.01)

(52) U.S. Cl.
  CPC .............. *H03F 3/16* (2013.01); *G11C 27/02* (2013.01); *H03F 2200/297* (2013.01); *H03F 2200/411* (2013.01)

(58) Field of Classification Search
  CPC ....... H01L 2924/00; H01L 2924/00014; H01L 2924/13091; H01L 2924/181
  See application file for complete search history.

(56) References Cited

U.S. PATENT DOCUMENTS

| | | | |
|---|---|---|---|
| 6,188,211 B1 | 2/2001 | Rincon-Mora et al. | |
| 7,667,477 B2* | 2/2010 | Nagata | G01R 29/26 257/48 |
| 7,928,873 B1* | 4/2011 | Huang | H03M 1/129 341/122 |
| 2004/0227829 A1 | 11/2004 | Wixson et al. | |

(Continued)

OTHER PUBLICATIONS

"Hittite's 18 GHz Ultra Wideband Track-and-Hold Amplifier Enhances High Speed ADS Performance," retrieved from <http://www.hittite.com>, Feb. 12, 2014, 3 pgs.

(Continued)

*Primary Examiner* — Sibin Chen
(74) *Attorney, Agent, or Firm* — McDermott Will & Emery LLP

(57) ABSTRACT

Examples are provided for a multi-stage track-and-hold circuit (THA). The multi-stage THA may include a first stage, a second stage, and a third stage. The first stage may be coupled to an input signal and configured to sample the input signal. The second stage may be coupled to the first stage and may include a buffer circuit. The third stage may be coupled to the second stage and can include a bootstrapped THA. The first stage may further include a shunted source-follower circuit and a switched source-follower circuit. The shunted source-follower circuit may include a first switch that can be operable to couple an output node of the shunted source-follower circuit to ground potential.

20 Claims, 5 Drawing Sheets

(56) References Cited

U.S. PATENT DOCUMENTS

2005/0245978 A1\* 11/2005 Varrichio ............... H02M 3/07
                                                        607/11
2011/0069563 A1   3/2011  Castaldo et al.
2013/0033302 A1   2/2013  Ali

OTHER PUBLICATIONS

Sedighi, et al., "A CMOS Track-and-Hold Circuit with beyond 30 GHz Input Bandwidth," IEEE, 2012, pp. 113-116.
Shahramian, et al., "A 30-GS/sec Track and Hold Amplifier in 0.13-μm CMOS Technology," retrieved from <http://www.osti.gov/eprints/topicpages/documents/record/311/1246276.html.

\* cited by examiner

US 9,692,364 B2

MULTI-STAGE TRACK-AND-HOLD AMPLIFIER

CROSS-REFERENCE TO RELATED APPLICATIONS

This application is a continuation application of the U.S. patent application Ser. No. 14/179,503 filed Feb. 12, 2014, issued as U.S. Pat. No. 9,337,785, which is incorporated herein by reference in its entirety.

FIELD

The disclosure relates in general to mixed signal systems, and more particularly, for example, to a high-linearity, ultra-wideband multi-stage track-and-hold amplifier with a shunted source-follower first-stage.

BACKGROUND

Wideband track-and-hold amplifiers (THAs), particularly, CMOS THAs can be used in many applications such as on-chip (e.g., CMOS) high-speed acquisition systems, sub-sampling receivers, and advanced communication systems using software-defined radio (SDR) that digitize radio-frequency (RF) signals close to the antenna. Existing THA solutions, although working for their intended applications, suffer from a number of limitations. For example, a bootstrapped switch solution may have limited bandwidth and low linearity due to reduced efficacy of the bootstrapped path at high input-signal frequencies, and may not be scalable with load values. A switched source-follower solution may lack sufficient headroom and may have a limited hold-state isolation due to capacitive feed-through from the input. The multi-chip solutions, on the other hand, are complex, with a high count of external components, costly, power hungry, and need to drive signals off-chip through inter-chip interconnects and/or bond-wires, which add parasitic capacitances and inductances.

SUMMARY

In one aspect of the disclosure, examples are provided of an ultra-wideband multi-stage track-and-hold amplifier (THA) with a shunted-source-follower first-stage. The ultra-wideband multi-stage THA (e.g., with approximately 43 GHz bandwidth) of the subject technology provides a high-linearity solution, for example, with approximately 55 dB spurious-free dynamic range (SFDR), with lower cost and complexity and reduced external component counts. The disclosed ultra-wideband multi-stage THA avoids driving signal off-chip and can be entirely implemented on CMOS (e.g., 32 nm silicon-on-insulator (SOI) CMOS). Therefore, the subject technology saves on inter-chip connections and bond-wires and consequently reduces interconnects parasitic capacitances.

In some aspects of the disclosure, a multi-stage THA may include a first stage, a second stage, and a third stage. The first stage may be coupled to an input signal and configured to sample the input signal. The second stage may be coupled to the first stage and can include a buffer circuit. The third stage may be coupled to the second stage and can include a bootstrapped THA. The first stage may further include a shunted source-follower circuit and a switched source-follower circuit. The shunted source-follower circuit may include a first switch that can be operable to couple an output node of the shunted source-follower circuit to ground potential.

In other aspects of the disclosure, an example method for providing a multi-stage THA includes coupling a first stage to an input signal and configuring the first stage to sample the input signal. A second stage may be coupled to the first stage. The second stage may include a buffer circuit. A third stage may be coupled to the second stage. The third stage may include a bootstrapped THA. Coupling the first stage may include coupling a shunted source-follower circuit to a switched source-follower circuit. The shunted source-follower circuit may include a first switch that is operable to couple an output node of the shunted source-follower circuit to ground potential.

In yet other aspects of the disclosure, a system may include a multi-stage THA and an analog-to-digital convertor (ADC). The multi-stage THA may be configured to receive an input analog signal and to generate sampled signals. The ADC may be configured to convert the sampled signals to a digital signal. The multi-stage THA includes a first stage coupled to the input analog signal and configured to sample the input analog signal; a second stage coupled to the first stage and including a buffer circuit; and a third stage coupled to the second stage and including a bootstrapped THA. The first stage may include a shunted source-follower circuit and a switched source-follower circuit. The shunted source-follower circuit may include a first switch operable to couple an output node of the shunted source-follower circuit to ground potential. The switched source-follower circuit may include a second switch.

It is understood that various configurations of the subject technology will become readily apparent to those skilled in the art from the disclosure, wherein various configurations of the subject technology are shown and described by way of illustration. As will be realized, the subject technology is capable of other and different configurations and its several details are capable of modification in various other respects, all without departing from the scope of the subject technology. Accordingly, the summary, drawings and detailed description are to be regarded as illustrative in nature and not as restrictive.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be apparent to those skilled in the art that the subject technology may be practiced without these specific details. In some instances, well-known structures and components are shown in block diagram form in order to avoid obscuring the concepts of the subject technology. Like components are labeled with identical element numbers for ease of understanding. Please note that the term "example" is used herein as a noun or an adjective.

In one or more aspects, the subject technology is directed to methods and implementations for providing a high linearity, ultra-wideband multi-stage track-and-hold amplifier (THA). The multi-stage THA of the subject technology may include a shunted-source-follower first-stage that can prevent hold-mode feed-through during the hold state, as discussed in more details herein. The disclosed multi-stage THA includes multiple advantageous features. For example, an ultra-wide bandwidth (e.g., approximately 43 GHz), a high linearity characterized by a high spurious-free dynamic range (SFDR) (e.g., approximately 55 dB), and a high worst case signal-to-noise plus dynamic range (SNDR) (e.g., approximately 46 dB). Further, the disclosed multi-stage THA can be entirely implemented in CMOS technology at low cost and does not use off-chip signaling. As compared to the complex multichip solutions, the disclosed solution is much simpler and consumes significantly less power.

Figure 1:
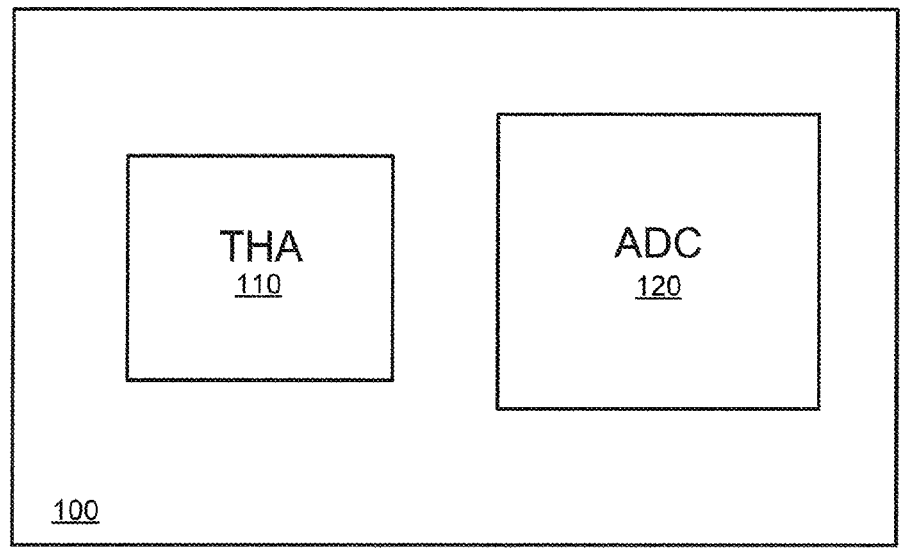
FIG. 1 is a high-level architecture of an example of a system using a multi-stage track-and-hold amplifier (THA) with a shunted-source-follower first-stage.

FIG. 1 is a high-level architecture of an example of a system 100 using a multi-stage track-and-hold amplifier (THA) 110 with a shunted-source-follower first-stage. The system 100 may be a part of a more complex system such as on-chip (e.g., CMOS) high-speed acquisition system, a sub-sampling receiver, or an advanced communication systems using software-defined radio (SDR). The system 100 includes a THA 110 and an analog-to-digital converter (ADC) 120. The THA 110 may be a high-linearity, ultra-wideband multi-stage THA with a shunted-source-follower first-stage, as discussed in more detail herein. The ADC 120 may be high speed ADC that benefits from the high linearity and ultra-wide bandwidth of the THA 110.

Figure 2A:
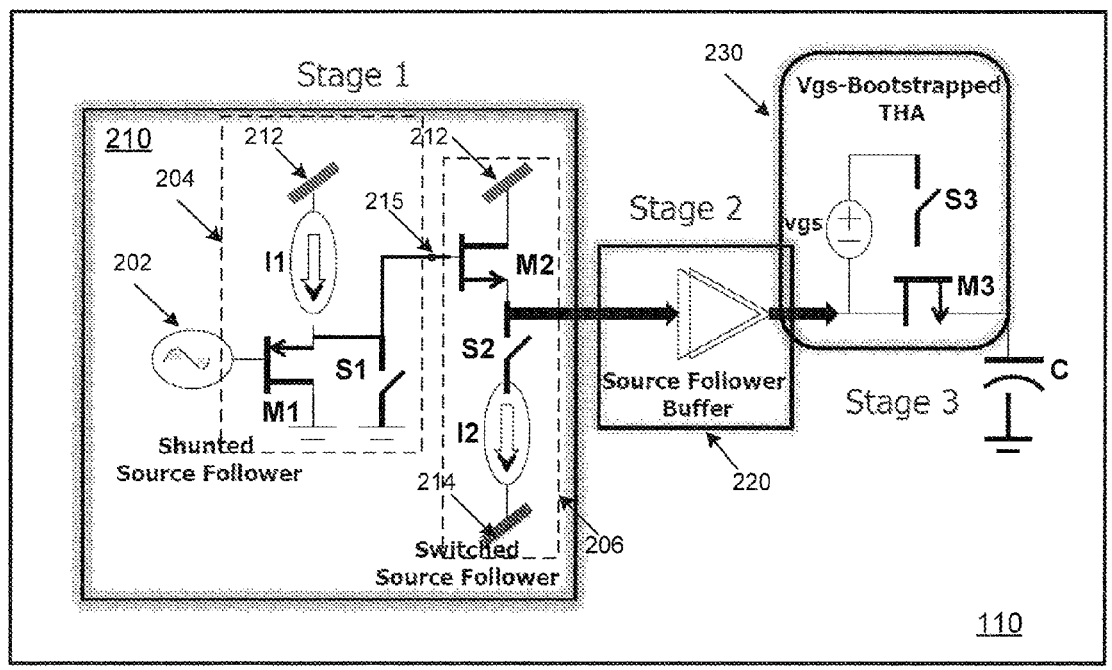
FIG. 2A is an architectural diagram of an example of a multi-stage THA with a shunted-source-follower first-stage.

FIG. 2A is an architectural diagram of an example of a multi-stage THA 110 with a shunted-source-follower first-stage 210. The multi-stage THA 110 includes a first stage (e.g., an input stage) 210, a second stage 220, and a third stage (e.g., an output stage) 230. The first stage 210 may be coupled to an input signal 202 (e.g., an analog signal) and can sample the input signal 202. The second stage 220 may be coupled to the first stage 210 and may include a buffer circuit. The third stage 230 may be coupled to the second stage 220 and may include a Vgs-bootstrapped THA.

The first stage 210 includes a shunted source-follower circuit 204 and a switched source-follower circuit 206. In one or more implementations, the shunted-source-follower circuit 204 includes the first MOS transistor M1 (e.g., a p-channel metal-oxide semiconductor (PMOS) transistor, hereinafter "transistor M1"), a current source I1, and a first switch (e.g., a shunt switch) S1 that couple an output node 215 of the shunted-source-follower circuit 204 to ground potential. The current source I1 is coupled between a source node of the transistor M1 and a first power supply (e.g., a positive voltage supply) 212. A gate terminal of the M1 transistor is coupled to the input signal 202, and a drain node of transistor M1 is coupled to the ground potential.

In some aspects, the switched source-follower circuit 206 includes a second MOS transistor M2 (e.g., an n-channel metal-oxide semiconductor (NMOS) transistor, hereinafter "transistor M2"), a second switch S2 and a second current source I2 coupled between a first terminal of the switch S2 and a second power supply (e.g., a negative voltage supply) 214. A second terminal of the switch S2 is coupled to a source node of the transistor M2. A gate node of the transistor M2 is coupled to the output node 215 of the shunted source-follower circuit 204, and a drain node of the transistor M2 is coupled to the power supply 212. The output of the switched source-follower circuit 206 is taken from the source node of the transistor M2.

In the hold-mode of the first stage 210, as discussed below, the shunt switch S1 is closed and the shunted source-follower circuit 204 drives a low-impedance, which can drastically suppress hold-mode feed-through parasitic (e.g., capacitance feed-through) signals. The other advantage is the isolation of the shunt switch from the input signal 202. This enables multiple (e.g., two or higher number) THAs to be coupled to operate in parallel (e.g., for time interleaving) or the input signal be sampled at both clock edges (e.g., falling and rising edges). Further, the input impedance is matched, independent of whether the shunt switch S1 is open or closed, with the impedance (e.g., 50Q) of a source of the input signal 202, which results in a high return-loss.

In the hold-mode of the first stage 210 when the transistor M1 is off, in the absence of the shunt switch S1, the gate of the transistor M2 of the switched source-follower circuit 206 could be floating (e.g., become a high-impedance node). This could result in hold-mode feed-through due to coupling through the gate-capacitance of the transistor M2. However, the shunted switch S1 can prevent such a feed-through coupling. The second stage 220 buffers the input stage 210 from the output stage 230, therefore reduces load on the input stage 210, which can result in higher bandwidth. The second stage 220 may be implemented with one or more source follower stages and is configured to present a low capacitance load to the first stage 210 in order to enhance a bandwidth of the first stage 210. The second stage 220 may also be beneficial by enabling driving of multiple output stages (e.g., for time-interleaving).

In one or more implementations, the third stage 230 may include a low-power Vgs-bootstrapped block including, but not limited to, a switch S3, a third transistor M3 (e.g., an output transistor, such as an NMOS transistor, hereinafter "transistor M3"), and a Vgs voltage-source. In the Vgs-bootstrapped block, which is a known block, the Vgs of the output transistor (e.g., transistor M3) is added via the switch S3 to the signal that is provided to a gate node of the output transistor M3. This mechanism can enable achieving high linearity. The third stage 230 can drive a load (e.g., a load capacitance C, such as 200 fF) with high linearity, drastically reduced noise, and low power consumption. In some aspects, the switches S1-S3 can be implemented in CMOS and can be controlled by various phases of the system clock, not shown herein for simplicity.

Figure 2B:
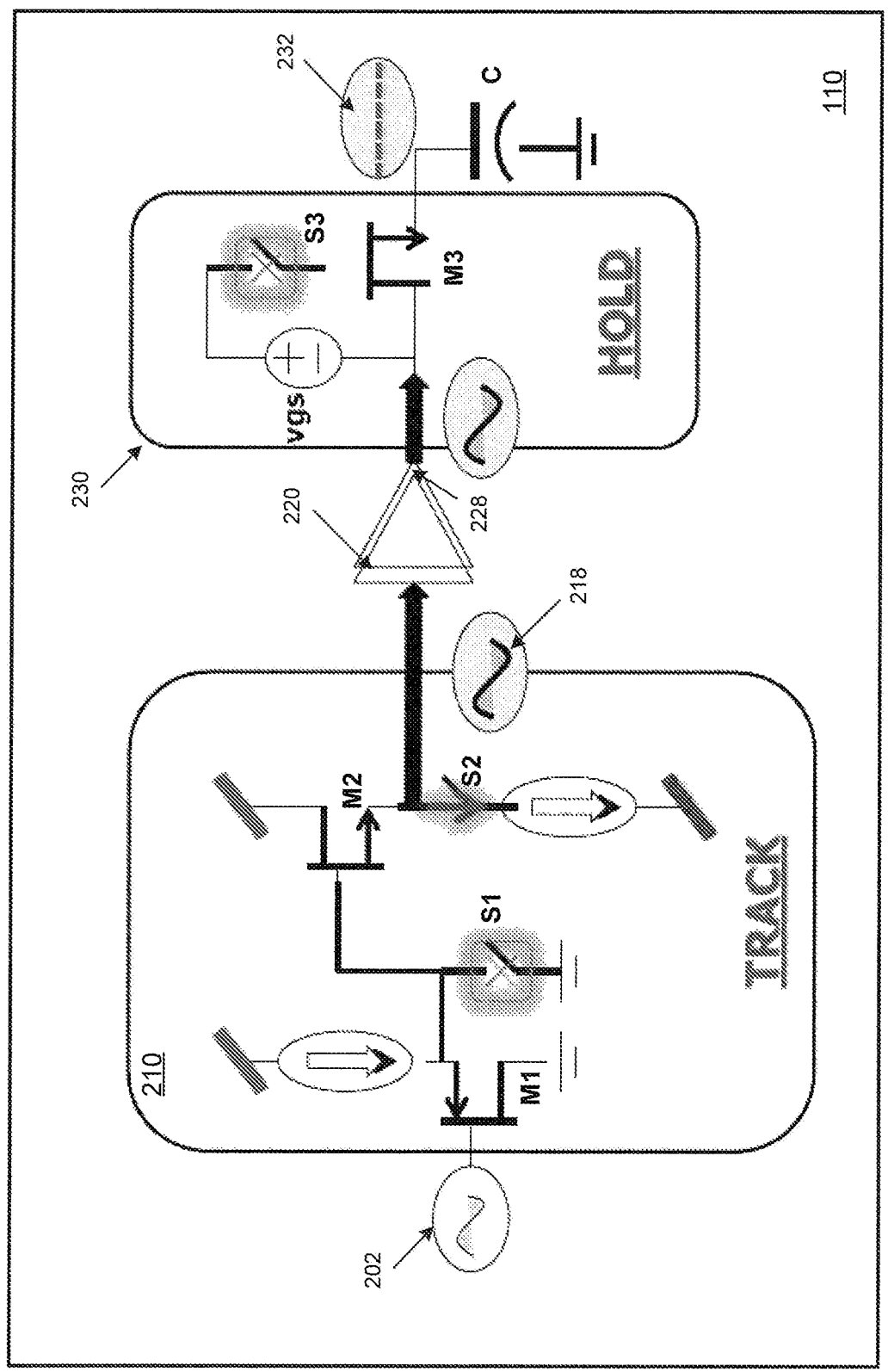
FIGS. 2B and 2C are functional diagrams illustrating transient operations of the example multi-stage THA with a shunted-source-follower first-stage of FIG. 2A.
Figure 2C:
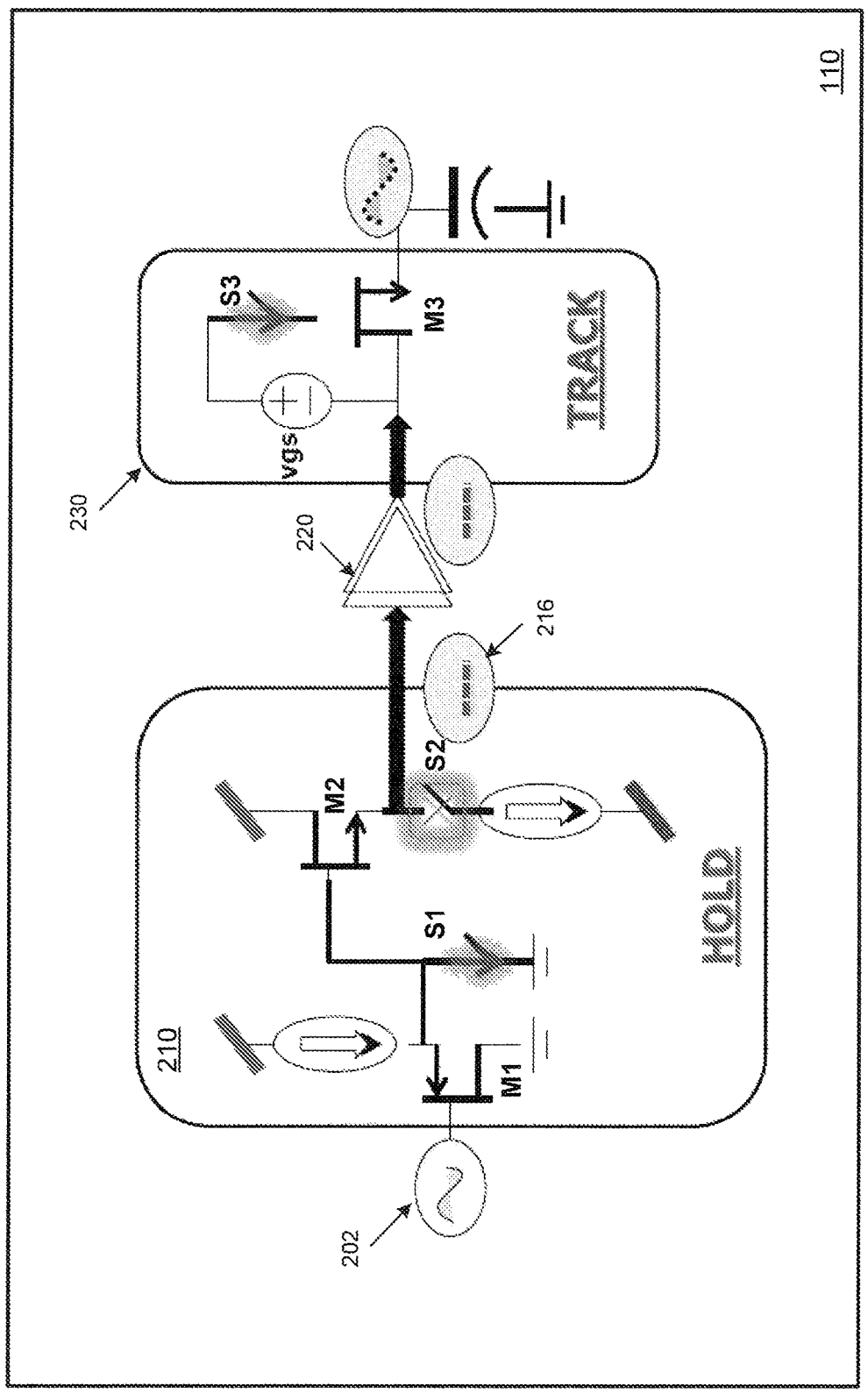

FIGS. 2B and 2C are functional diagrams illustrating transient operations of the example multi-stage THA 110 with a shunted-source-follower first-stage of FIG. 2A. The first and the third stages 210 and 230 can have a dynamic structure due to the presence of the switches S1, S2, and S3, which can be closed or open during track or hold states of the multi-stage THA 110. For example, during a hold-state if the multi-stage THA 110, as shown in FIG. 2B, the first stage 210 is in a track-mode, whereas the third stage 230 is in a hold-mode. During the track-mode of the first stage 210, the switch S1 is open and the switch S2 is closed, transistors M1 and M2 are conducting, and samples of the input signal 202 can appear as an output signal 218 at the output of the first stage 210 (e.g., a source node of the transistor M2) and, through the buffer circuit (e.g., the second stage 220), at the input node 228 of the third stage 230. The third stage 230, however, is in hold mode, as the switch S3 is open and the transistor M3 is not conducting. Therefore, an output signal 232 of the third stage 230 is not a representative of the samples of the input signal 202, which cannot reach the output node of the multi-stage THA 110 (e.g., connected to a source node of the transistor M3 and the load capacitance C). Therefore, the charge on the load capacitance C is maintained without being affected by the time variation of the input signal 202.

In one or more aspects, during a track-state of the multi-stage THA 110, as shown in FIG. 2C, the first stage 210 is in a hold-mode, whereas the third stage 230 is in a track-mode. During the hold-mode of the first stage 210, the switch S1 is closed and the switch S2 is open, the gate node of the transistors M2 is shorted to the ground potential and the transistor M2 is off, thus the input signal 202 is isolated from the output of the first stage 210 (see flat output signal 216 of the first stage 210). Therefore, the input node of the third stage 230 is also isolated from the input signal 202. The third stage 230, however, is in track mode, as the switch S3 is closed and the transistor M3 is conducting. Therefore, the load capacitance C is charged with the current value of the input signal of the third stage 230. The dotted sinusoidal waveform at the output of the third stage 230 represents a sampled and held signal constituting multiple sample instants (dots) and not just a single track state discussed above.

Figure 3:
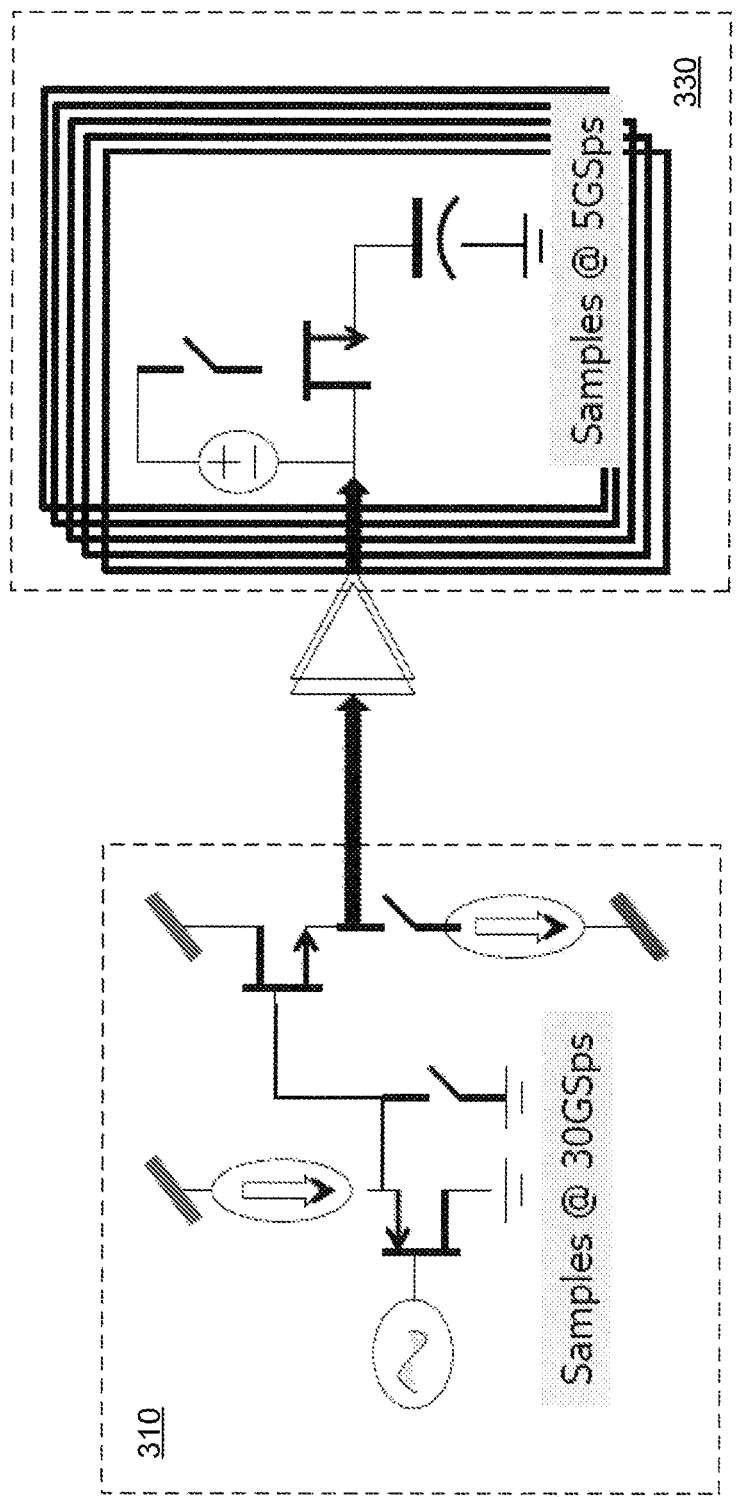
FIG. 3 is a diagram illustrating an example of a high-frequency implementation with a third stage formed by a combination of a number of interleaved Vgs-bootstrapped blocks.

FIG. 3 is a diagram illustrating an example of a high-frequency implementation with a third stage formed by a combination of a number of interleaved Vgs-bootstrapped blocks. In the high-frequency implementation shown in FIG. 3, the first stage 310 is similar to the first stage 210 of FIG. 2A and is configured to operate at a high sample rate (e.g., 30 GSps). The third stage 330 is formed by a combination of multiple (e.g., 6) interleaved Vgs-bootstrapped blocks, each of which is similar to the third stage 230 of FIG. 2A and is configured to operate at a fraction of the operating frequency of the first stage 310 (e.g., at 5 GSps). The third stage 330 provides multiple (e.g., 6) outputs, each corresponding to one of the multiple interleaved Vgs-bootstrapped blocks.

Figure 4:
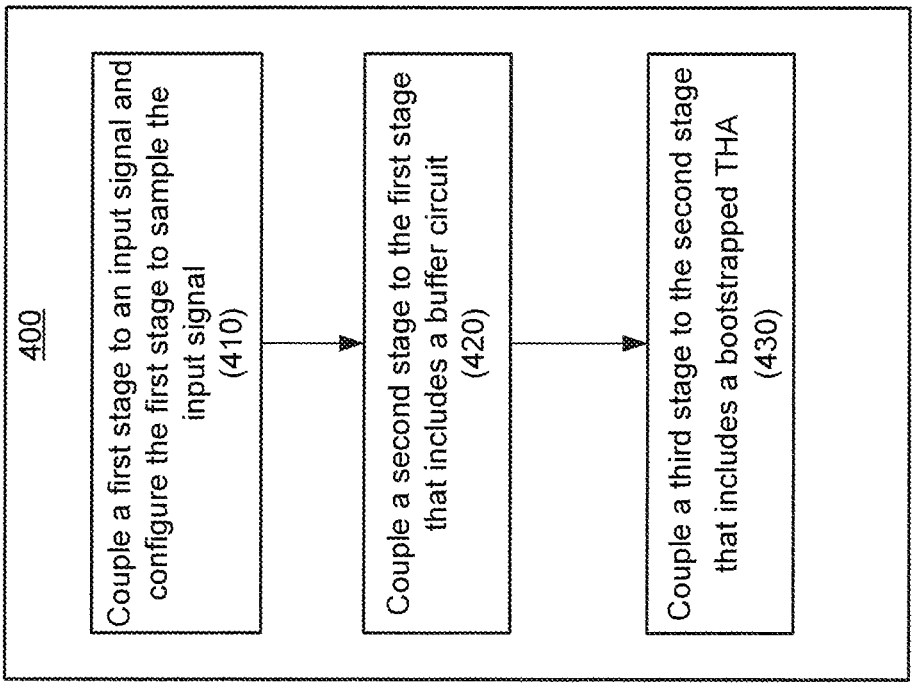
FIG. 4 is a flow diagram illustrating an example of a method for providing a THA with a shunted-source-follower first-stage.

FIG. 4 is a flow diagram illustrating an example of a method 400 for a THA with a shunted-source-follower first-stage. The method 400 starts at operation block 410, where a first stage (e.g., 210 of FIG. 2A) is coupled to an input signal (e.g., 202 of FIG. 2A) and is configured to sample the input signal. At operation block 420, a second stage (e.g., 220 of FIG. 2A) may be coupled to the first stage. The second stage may include a buffer circuit. A third stage (e.g., 230 of FIG. 2A) may be coupled (at operation block 430) to the second stage. The third stage may include a bootstrapped THA. Coupling the first stage may include coupling a shunted source-follower circuit (e.g., 204 of FIG. 2A) to a switched source-follower circuit (e.g., 206 of FIG. 2A). The shunted source-follower circuit may include a first switch (e.g., S1 of FIG. 2A) that is operable to couple an output node (e.g., 215 of FIG. 2A) of the shunted source-follower circuit to ground potential.

Illustration of Subject Technology as Clauses

Various examples of aspects of the disclosure are described as numbered clauses (1, 2, 3, etc.) for convenience. These are provided as examples, and do not limit the subject technology. Identifications of the figures and reference numbers are provided below merely as examples and for illustrative purposes, and the clauses are not limited by those identifications.

1. A multi-stage track-and-hold amplifier (THA) (e.g., 110 of FIG. 2A), comprising:
   a first stage (e.g., 210 of FIG. 2A) configured to receive an input signal and configured to sample the input signal (e.g., 202 of FIG. 2A);
   a second stage (e.g., 220 of FIG. 2A) coupled to the first stage and including a buffer circuit; and
   a third stage (e.g., 230 of FIG. 2A) coupled to the second stage and including a track-and-hold amplifier,
   wherein:
      the first stage comprises a shunted source-follower circuit (e.g., 204 of FIG. 2A) and a switched source-follower circuit (e.g., 206 of FIG. 2A), and
      the shunted source-follower circuit includes a first switch (e.g., S1 of FIG. 2A) operable to couple an output node (e.g., 215 of FIG. 2A) of the shunted source-follower circuit to ground potential.

2. The multi-stage THA of clause for any other clause, wherein:
   the shunted source-follower circuit comprises a first MOS transistor and a first current source that couples a source of the first MOS transistor to a first power supply,
   the first MOS transistor comprises a PMOS or an NMOS transistor,
   the first MOS transistor comprises the PMOS transistor, if the input signal includes a low common-mode voltage,
   the first power supply is configured to provide a positive supply voltage, and
   a gate node of the first MOS transistor is coupled to the input signal and a drain node of the MOS transistor is coupled to ground potential.

3. The multi-stage THA of clause 1 or any other clause, wherein:
   the output node of the shunted source-follower circuit comprises the source of first MOS transistor,
   the first switch comprises a shunt switch and is operable to couple the output node of the shunted source-follower circuit to ground potential, when the first stage is in a hold mode, to provide a reduced hold-mode feed-through and to prevent an input of the second stage from floating.
   the first switch is operable to be an open circuit when the first stage is in a track mode, and
   the first stage is in the track mode when the multi-stage THA is in a hold state.

4. The multi-stage THA of clause 1 or any other clause, wherein:
   the switched source-follower circuit comprises a second MOS transistor, a second switch, and a second current source,
   the second MOS transistor comprises an NMOS or a PMOS transistor,
   the second MOS transistor comprises the NMOS transistor where the first MOS transistor is a PMOS transistor,
   a gate node of the second MOS transistor is coupled to the output node of the shunted source-follower circuit,
   a drain node of the second MOS transistor is coupled to the first power supply, the second switch is operable to couple a source node of the second MOS transistor to the second current source, the second current source is coupled to a second power supply, and the second power supply is configured to provide a negative supply voltage.

5. The multi-stage THA of clause 4 or any other clause or any other clause, wherein:

the second switch is operable to couple the source node of the second MOS transistor to the current source when the first stage is in a track mode, the second switch is operable to decouple the source node of the second MOS transistor from the current source when the first stage is in a hold mode, and the first stage is in a hold mode when the multi-stage THA is in a track state.

6. The multi-stage THA of clause 1 or any other clause, wherein:

the buffer circuit comprises a class-A source follower, the buffer circuit is configured to isolate the first stage from the third stage to reduce a load on the first stage, and the buffer circuit is configured to present a low input-capacitance to the first stage to enhance a bandwidth of the first stage and enable an ultra-wide bandwidth for the multi-stage THA.

7. The multi-stage THA of clause 1 or any other clause, wherein:

the buffer circuit allows parallel operation of a plurality of multi-stage THAs, and the parallel operation of the plurality of multi-stage THAs facilitates time-interleaving of multiple high-frequency input signals.

8. The multi-stage THA of clause 1 or any other clause, wherein:

the track-and-hold amplifier of the third stage comprises a Vgs-bootstrapped track-and-hold amplifier configured to process a sampled signal generated by the first stage, and the Vgs-bootstrapped track-and-hold amplifier includes a Vgs-bootstrapped switch configured to achieve a high-linearity performance, and the Vgs-bootstrapped switch is a low-power switch, the Vgs-bootstrapped switch is operable to be closed when the third stage is in a track mode, the third stage is in the track mode when the multi-stage THA is in a track state the third stage comprises multiple track-and-hold amplifiers, and each of the multiple track-and-hold amplifiers is configured to operate at a fraction of a sampling rate of the first stage.

9. A method (e.g., 400 of FIG. 4) for providing a multi-stage track-and-hold amplifier (THA), comprising:

configuring a first stage to receive an input signal and configuring the first stage to sample the input signal (e.g., 410 of FIG. 4);

coupling a second stage to the first stage, the second stage including a buffer circuit (e.g., 420 of FIG. 4); and coupling a third stage to the second stage, the third stage including a track-and-hold amplifier (e.g., 430 of FIG. 4), wherein:

the first stage comprises a shunted source-follower circuit (e.g., 204 of FIG. 2A) coupled to a switched source-follower circuit (e.g., 206 of FIG. 2A), and the shunted source-follower circuit includes a first switch (e.g., S1 of FIG. 2A) operable to couple an output node (e.g., 215 of FIG. 2A) of the shunted source-follower circuit to ground potential.

10. The method of clause 9 or any other clause, wherein:

the shunted source-follower comprises a first MOS transistor and a first current source, the first MOS transistor comprises a PMOS or an NMOS transistor, the first MOS transistor comprises the PMOS transistor, if the input signal includes a low common-mode voltage, and the method comprises:

coupling a source of the first MOS transistor to a first power supply;

configuring the first power supply to provide a positive supply voltage;

coupling a gate node of the first MOS transistor to the input signal; and coupling a drain node of the first MOS transistor to ground potential.

11. The method of clause 10, comprising:

configuring the source of the first MOS transistor as the output node of the shunted source-follower circuit;

configuring the first switch to couple the output node of the shunted source-follower circuit to ground potential, when the first stage is in a hold mode, to provide a reduced hold-mode feed-through and to prevent an input of the second stage from floating; and configuring the first switch to be an open circuit when the first stage is in a track mode, wherein the first stage is in the track mode when the multi-stage THA is in a hold state.

12. The method of clause 9, further comprising:

forming the switched source-follower circuit by coupling a second MOS transistor, a second switch, and a second current source;

coupling a gate node of the second MOS transistor to the output node of the shunted source-follower circuit;

coupling a drain node of the second MOS transistor to the first power supply;

configuring the second switch to couple a source node of the second MOS transistor to the second current source;

coupling the second current source to a second power supply; and configuring the second power supply to provide a negative supply voltage, wherein the second MOS transistor comprises an NMOS or a PMOS transistor, and wherein the second MOS transistor comprises the NMOS transistor where the first MOS transistor is a PMOS transistor, 13. The method of clause 12, further comprising:

configuring the second switch to couple the source node of the second MOS transistor to the current source when the first stage is in a track mode; and configuring the second switch to decouple the source node of the second MOS transistor from the current source when the first stage is in a hold mode, wherein the first stage is in a hold mode when the multi-stage THA is in a track state.

14. The method of clause 9 or any other clause, wherein:

the buffer circuit comprises a class-A source follower, and the method comprises:

configuring the buffer circuit to isolate the first stage from the third stage to reduce a load on the first stage, and configuring the buffer circuit to present a low input-capacitance to the first stage to enhance a bandwidth of the first stage and enable an ultra-wide bandwidth for the multi-stage THA.

15. The method of clause 9, further comprising:
configuring the buffer circuit to enable parallel operation of a plurality of multi-stage THAs,
wherein the parallel operation of the plurality of multi-stage THAs facilitates time-interleaving of multiple input signals.

16. The method of clause 9 or any other clause, wherein:
the track-and-hold amplifier of the third stage comprises a Vgs-bootstrapped track-and-hold amplifier, and
the Vgs-bootstrapped track-and-hold amplifier includes a Vgs-bootstrapped switch, and
the method comprises:
  configuring the Vgs-bootstrapped track-and-hold amplifier to process a sampled signal generated by the first stage;
  configuring the Vgs-bootstrapped switch to achieve a high-linearity performance;
  configuring the Vgs-bootstrapped switch to be closed when the third stage is in a track mode;
  configuring the multi-stage THA to allow the third stage to be in the track mode when the multi-stage THA is in a track state, wherein the Vgs-bootstrapped switch is a low-power switch;
configuring the third stage by coupling multiple track-and-hold amplifiers in parallel; and
configuring each of the multiple track-and-hold amplifiers to operate at a fraction of a sampling rate of the first stage.

17. A system (e.g., 100 of FIG. 1) comprising:
A multi-stage track-and-hold amplifier (THA) (e.g., 110 of FIG. 2A) configured to receive an input analog signal (e.g., 202 of FIG. 2A) and to generate sampled signals; and
an analog-to-digital convertor (ADC) (e.g., 120 of FIG. 1) configured to convert the sampled signals to a digital signal,
wherein the multi-stage THA comprises:
  a first stage (e.g., 210 of FIG. 2A) configured to receive the input analog signal and configured to sample the input analog signal;
  a second stage (e.g., 220 of FIG. 2A) coupled to the first stage and including a buffer circuit; and
  a third stage (e.g., 230 of FIG. 2A) coupled to the second stage and including a track-and-hold amplifier, and
  wherein:
    the first stage comprises a shunted source-follower circuit (e.g., 204 of FIG. 2A) and a switched source-follower circuit (e.g., 206 of FIG. 2A),
    the shunted source-follower circuit includes a first switch (e.g., S1 of FIG. 2A) operable to couple an output node (e.g., 215 of FIG. 2A) of the shunted source-follower circuit to ground potential, and
    the switched source-follower circuit comprises a second switch (e.g., S2 of FIG. 2A).

18. The system of clause 17 or any other clause, wherein:
the shunted source-follower circuit comprises a first MOS transistor and a first current source that couples a source of MOS transistor to a first power supply,
the first MOS transistor comprises a PMOS or an NMOS transistor,
the first MOS transistor comprises the PMOS transistor, if the input signal includes a low common-mode voltage the first power supply is configured to provide a positive supply voltage, and
a gate node of the first MOS transistor is coupled to the input signal and a drain node of the MOS transistor is coupled to ground potential.

19. The system of clause 17 or any other clause, wherein:
the output node of the shunted source-follower circuit comprises the source of first MOS transistor,
the first switch comprises a shunt switch and is operable to couple the output node of the shunted source-follower circuit to ground potential, when the first stage is in a hold mode, to provide a reduced hold-mode feed-through and to prevent an input of the second stage from floating.
the first switch is operable to be an open circuit when the first stage is in a track mode, and
the first stage is in the track mode when the multi-stage THA is in a hold state.

20. The system of clause 17,
the switched source-follower circuit comprises a second MOS transistor, a second switch, and a second current source,
the second MOS transistor comprises an NMOS or a PMOS transistor,
the second MOS transistor comprises the NMOS transistor where the first MOS transistor is a PMOS transistor,
a gate node of the second MOS transistor is coupled to the output node of the shunted source-follower circuit,
a drain node of the second MOS transistor is coupled to the first power supply,
the second switch is operable to couple a source node of the second MOS transistor to the current source,
the current source is coupled to a second power supply, and the second power supply is configured to provide a negative supply voltage.

21. A hardware apparatus comprising circuits configured to perform one or more methods or operations of any one of clauses 9-16 (e.g., Apparatus of FIG. 2A) or any other clauses.

Figure 5:
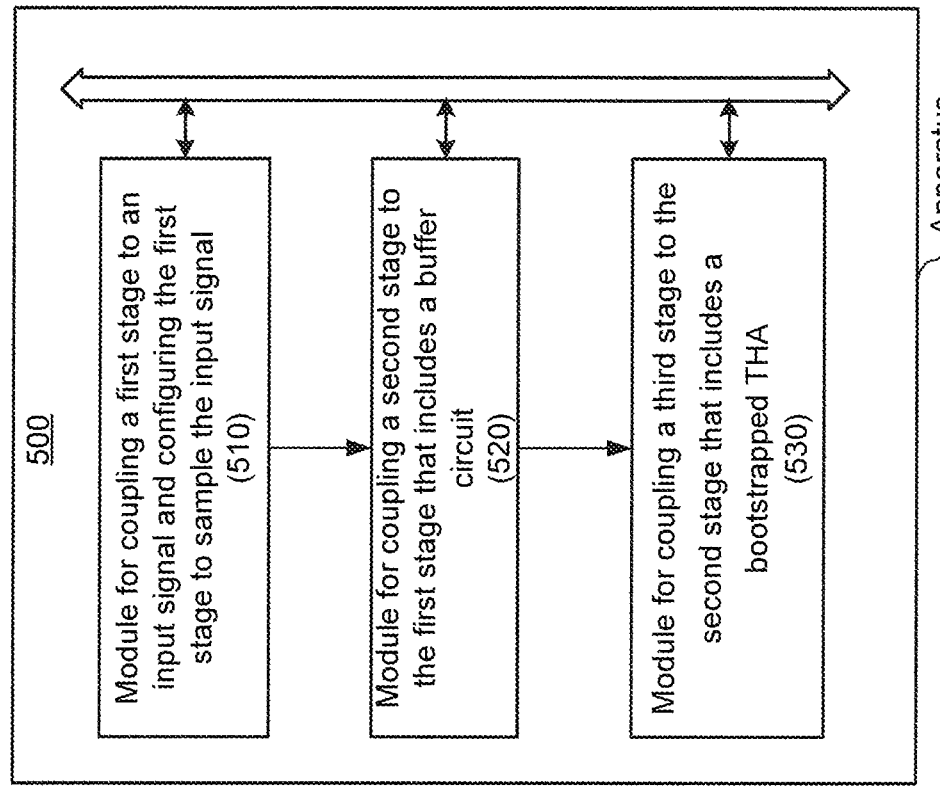
FIG. 5 is diagram illustrating an example of an apparatus including modules for a THA with a shunted-source-follower first-stage.

22. An apparatus comprising means (e.g., modules 510-530 of Apparatus of FIG. 5) adapted for performing one or more methods or operations of any one of clauses 9-16 or any other clauses.

In one aspect, any of the clauses herein may depend from any one of the independent clauses or any one of the dependent clauses. In one aspect, any of the clauses (e.g., dependent or independent clauses) may be combined with any other clauses (e.g., dependent or independent clauses). In one aspect, a claim may include some or all of the words (e.g., steps, operations, means or components) recited in a clause, a sentence, a phrase or a paragraph. In one aspect, a claim may include some or all of the words recited in one or more clauses, sentences, phrases or paragraphs. In one aspect, some of the words in each of the clauses, sentences, phrases or paragraphs may be removed. In one aspect, additional words or elements may be added to a clause, a sentence, a phrase or a paragraph. In one aspect, the subject technology may be implemented without utilizing some of the components, elements, functions or operations described herein. In one aspect, the subject technology may be implemented utilizing additional components, elements, functions or operations.

In one aspect, any methods, instructions, code, means, logic, components, blocks, modules and the like (e.g., software or hardware) described or claimed herein can be represented in drawings (e.g., flow charts, block diagrams), such drawings (regardless of whether explicitly shown or not) are expressly incorporated herein by reference, and such drawings (if not yet explicitly shown) can be added to the disclosure without constituting new matter. For brevity, some (but not necessarily all) of the clauses/descriptions/claims are explicitly represented in drawings, but any of the clauses/descriptions/claims can be represented in drawings in a manner similar to those drawings explicitly shown. For example, a flow chart can be drawn for any of the clauses, sentences or claims for a method such that each operation or step is connected to the next operation or step by an arrow. In another example, a block diagram can be drawn for any of the clauses, sentences or claims having means-for elements (e.g., means for performing an action) such that each means-for element can be represented as a module for element (e.g., a module for performing an action).

Those of skill in the art would appreciate that items such as the various illustrative blocks, modules, elements, components, methods, operations, steps, and algorithms described herein may be implemented as hardware or a combination of hardware and software.

To illustrate the interchangeability of hardware and software, items such as the various illustrative blocks, modules, elements, components, methods, operations, steps, and algorithms have been described generally in terms of their functionality. Whether such functionality is implemented as hardware or software depends upon the particular application and design constraints imposed on the overall system. Skilled artisans may implement the described functionality in varying ways for each particular application.

In one aspect, "means," a block, a module, an element, a component or a processor may be an item (e.g., one or more of blocks, modules, elements, components or processors) for performing one or more functions or operations. In one aspect, such an item may be an apparatus, hardware, or a portion thereof. In an example, an item may be implemented as one or more circuits configured to perform the function(s) or operation(s). A circuit may include one or more circuits and/or logic. A circuit may be analog and/or digital. A circuit may be electrical and/or optical. A circuit may include transistors. In an example, one or more items may be implemented as a processing system (e.g., a digital signal processor (DSP), an application specific integrated circuit (ASIC), a field programmable gate array (FPGA), etc.). In one example, an item may also include a structure in the form of, for example, an instruction(s) for performing the function(s) or operation(s), where the instruction(s) are encoded or stored on a machine-readable medium, on another device, or on a portion thereof, where an instruction(s) may be software, an application(s), a subroutine(s), or a portion thereof. Those skilled in the art will recognize how to implement the instructions, circuits, and processing systems.

A reference to an element in the singular is not intended to mean "one and only one" unless specifically so stated, but rather "one or more." For example, a clock signal may refer to one or more clock signals, a control signal may refer to one or more control signals, an input signal may refer to one or more input signals, an output signal may refer to one or more output signals, and a signal may refer to differential voltage signals or differential current signals.

Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the invention.

The word "exemplary" is used herein to mean "serving as an example or illustration." Any aspect or design described herein as "exemplary" is not necessarily to be construed as preferred or advantageous over other aspects or designs. In one aspect, various alternative configurations and operations described herein may be considered to be at least equivalent.

A phrase such as an "aspect" does not imply that such aspect is essential to the subject technology or that such aspect applies to all configurations of the subject technology. A disclosure relating to an aspect may apply to all configurations, or one or more configurations. An aspect may provide one or more examples. A phrase such as an aspect may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples. A phrase such an embodiment may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples. A phrase such a configuration may refer to one or more configurations and vice versa.

In one aspect of the disclosure, when actions or functions are described as being performed by an item (e.g., receiving, determining, providing, generating, converting, displaying, notifying, accepting, selecting, controlling, transmitting, reporting, sending, or any other action or function), it is understood that such actions or functions may be performed by the item directly or indirectly. In one aspect, when a module is described as performing an action, the module may be understood to perform the action directly. In one aspect, when a module is described as performing an action, the module may be understood to perform the action indirectly, for example, by facilitating, enabling or causing such an action.

In one aspect, unless otherwise stated, all measurements, values, ratings, positions, magnitudes, sizes, and other specifications that are set forth in this specification, including in the claims that follow, are approximate, not exact. In one aspect, they are intended to have a reasonable range that is consistent with the functions to which they relate and with what is customary in the art to which they pertain.

In one aspect, the term "coupled" or the like may refer to being directly coupled. In another aspect, the term "coupled" or the like may refer to being indirectly coupled.

Various items may be arranged differently (e.g., arranged in a different order, or partitioned in a different way) all without departing from the scope of the subject technology. In one aspect of the disclosure, the elements recited in the accompanying claims may be performed by one or more modules or sub-modules.

It is understood that the specific order or hierarchy of steps, operations or processes disclosed is an illustration of exemplary approaches. Based upon design preferences, it is understood that the specific order or hierarchy of steps, operations or processes may be rearranged. Some of the steps, operations or processes may be performed simultaneously. Some or all of the steps, operations, or processes may be performed automatically, without the intervention of a user. The accompanying method claims, if any, present elements of the various steps, operations or processes in a sample order, and are not meant to be limited to the specific order or hierarchy presented.

The disclosure is provided to enable any person skilled in the art to practice the various aspects described herein. The disclosure provides various examples of the subject technology, and the subject technology is not limited to these examples. Various modifications to these aspects will be readily apparent to those skilled in the art, and the generic principles defined herein may be applied to other aspects.

In one aspect, a transistor may refer to a bipolar junction transistor, a field effect transistor, or the like. In one aspect, capacitors and resistors may be implemented using transistor or diode elements. The subject technology, however, is not limited to these exemplary numbers, and can be implemented with other numbers of bits or components.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for." Furthermore, to the extent that the term "include," "have," or the like is used, such term is intended to be inclusive in a manner similar to the term "comprise" as "comprise" is interpreted when employed as a transitional word in a claim.

The Title, Background, Summary, Brief Description of the Drawings and Abstract of the disclosure are hereby incorporated into the disclosure and are provided as illustrative examples of the disclosure, not as restrictive descriptions. It is submitted with the understanding that they will not be used to limit the scope or meaning of the claims. In addition, in the Detailed Description, it can be seen that the description provides illustrative examples and the various features are grouped together in various embodiments for the purpose of streamlining the disclosure. This method of disclosure is not to be interpreted as reflecting an intention that the claimed subject matter requires more features than are expressly recited in each claim. Rather, as the following claims reflect, inventive subject matter lies in less than all features of a single disclosed configuration or operation. The following claims are hereby incorporated into the Detailed Description, with each claim standing on its own as a separately claimed subject matter.

The claims are not intended to be limited to the aspects described herein, but are to be accorded the full scope consistent with the language claims and to encompass all legal equivalents. Notwithstanding, none of the claims are intended to embrace subject matter that fails to satisfy the requirement of 35 U.S.C. §101, 102, or 103, nor should they be interpreted in such a way. Any unintended embracement of such subject matter is hereby disclaimed.

What is claimed is:

1. A multi-stage track-and-hold amplifier (THA), comprising:
a first stage configured to receive an input signal and configured to sample the input signal; and
a second stage coupled to the first stage and including a buffer circuit,
wherein:
the first stage comprises a shunted source-follower circuit and a switched source-follower circuit,
the shunted source-follower circuit includes a first current source and a first switch,
the switched source-follower circuit includes a second current source coupled via a second switch to an output node of the switched source-follower circuit, and
the buffer circuit comprises a class-A source follower configured to present a low input-capacitance to the first stage.

2. The multi-stage THA of claim 1, wherein:
the shunted source-follower circuit comprises a first MOS transistor and the first current source couples a source of the first MOS transistor to a node of a first power supply,
the first switch is operable to couple an output node of the shunted source-follower circuit to ground potential,
the first MOS transistor comprises a PMOS transistor, when the input signal includes a low common-mode voltage,
the first power supply is configured to provide a positive supply voltage, and
a gate node of the first MOS transistor is coupled to the input signal and a drain node of the first MOS transistor is coupled to ground potential.

3. The multi-stage THA of claim 2, wherein:
the output node of the shunted source-follower circuit comprises the source of the first MOS transistor,
the first switch comprises a shunt switch and is operable to couple the output node of the shunted source-follower circuit to ground potential, when the first stage is in a hold mode, to provide a reduced hold-mode feed-through and to prevent an input to the second stage from floating,
the first switch is operable to be an open circuit when the first stage is in a track mode, and
the first stage is in the track mode when the multi-stage THA is in a hold state.

4. The multi-stage THA of claim 2 wherein:
the switched source-follower circuit comprises a second MOS transistor coupled to the second switch, and the second current source,
the second MOS transistor comprises an NMOS transistor where the first MOS transistor is a PMOS transistor,
a gate node of the second MOS transistor is coupled to the output node of the shunted source-follower circuit,
a drain node of the second MOS transistor is coupled to the node of the first power supply,
the second switch is operable to couple a source node of the second MOS transistor to the second current source,
the second current source is coupled to a node of a second power supply, and
the second power supply is configured to provide a negative supply voltage.

5. The multi-stage THA of claim 4, wherein:
the second switch is operable to couple the source node of the second MOS transistor to the second current source when the first stage is in a track mode,
the second switch is operable to decouple the source node of the second MOS transistor from the second current source when the first stage is in a hold mode, and
the first stage is in a hold mode when the multi-stage THA is in a track state.

6. The multi-stage THA of claim 1, further comprising a third stage coupled to the second stage and including a track-and-hold circuit,
wherein:
the buffer circuit is configured to isolate the first stage from the third stage to reduce a load on the first stage, and the buffer circuit is configured to enhance a bandwidth of the first stage and to enable an ultra-wide bandwidth for the multi-stage THA.

7. The multi-stage THA of claim 6, wherein:
the track-and-hold circuit of the third stage comprises a Vgs-bootstrapped track-and-hold circuit configured to process a sampled signal generated by the first stage,
the Vgs-bootstrapped track-and-hold circuit includes a Vgs-bootstrapped switch configured to achieve a high-linearity performance,
the Vgs-bootstrapped switch is a low-power switch,
the Vgs-bootstrapped switch is operable to be closed when the third stage is in a track mode,
the third stage is in the track mode when the multi-stage THA is in a track state,
the third stage comprises multiple track-and-hold circuits, and
each of the multiple track-and-hold circuits is configured to operate at a fraction of a sampling rate of the first stage.

8. The multi-stage THA of claim 1, wherein:
the buffer circuit allows parallel operation of a plurality of multi-stage THAs, and
the parallel operation of the plurality of multi-stage THAs facilitates time-interleaving of multiple high-frequency input signals.

9. A method for providing a multi-stage track-and-hold amplifier (THA), comprising:
providing a first stage to receive an input signal and configuring the first stage to sample the input signal; and
coupling a second stage to the first stage, the second stage including a buffer circuit,
wherein:
providing the first stage comprises providing a switched source-follower circuit,
providing the switched source-follower circuit comprises coupling a second current source via a second switch to an output node of the switched source-follower circuit, and
the buffer circuit comprises a class-A source follower configured to present a low input-capacitance to the first stage.

10. The method of claim 9, wherein:
providing the first stage comprises providing a shunted source-follower circuit,
providing the shunted source-follower circuit comprises coupling a first current source and a first switch operable to couple an output node of the shunted source-follower circuit to ground potential,
the shunted source-follower circuit comprises a first MOS transistor and the first current source,
the first MOS transistor comprises a PMOS transistor, when the input signal includes a low common-mode voltage, and
the method comprises:
coupling a source of the first MOS transistor to a node of a first power supply through the first current source;
configuring the first power supply to provide a positive supply voltage;
coupling a gate node of the first MOS transistor to the input signal; and
coupling a drain node of the first MOS transistor to ground potential.

11. The method of claim 10, comprising:
configuring the source of the first MOS transistor as the output node of the shunted source-follower circuit;
configuring the first switch to couple the output node of the shunted source-follower circuit to ground potential, when the first stage is in a hold mode, to provide a reduced hold-mode feed-through and to prevent an input of the second stage from floating; and
configuring the first switch to be an open circuit when the first stage is in a track mode, wherein the first stage is in the track mode when the multi-stage THA is in a hold state.

12. The method of claim 10, further comprising:
forming the switched source-follower circuit by coupling a second MOS transistor to the second switch and the second current source;
coupling a gate node of the second MOS transistor to the output node of the shunted source-follower circuit;
coupling a drain node of the second MOS transistor to the node of the first power supply;
configuring the second switch to couple a source node of the second MOS transistor to the second current source;
coupling the second current source to a node of a second power supply; and
configuring the second power supply to provide a negative supply voltage,
wherein the second MOS transistor comprises an NMOS transistor where the first MOS transistor is a PMOS transistor.

13. The method of claim 12, further comprising:
configuring the second switch to couple the source node of the second MOS transistor to the second current source when the first stage is in a track mode; and
configuring the second switch to decouple the source node of the second MOS transistor from the second current source when the first stage is in a hold mode,
wherein the first stage is in a hold mode when the multi-stage THA is in a track state.

14. The method of claim 9, further comprising:
coupling a third stage to the second stage, the third stage including a track-and-hold circuit;
configuring the buffer circuit to isolate the first stage from the third stage to reduce a load on the first stage; and
configuring the buffer circuit to enhance a bandwidth of the first stage and enable an ultra-wide bandwidth for the multi-stage THA.

15. The method of claim 14, wherein:
the track-and-hold circuit of the third stage comprises a Vgs-bootstrapped track-and-hold circuit, and
the Vgs-bootstrapped track-and-hold circuit comprises a Vgs-bootstrapped switch, and
the method comprises:
configuring the Vgs-bootstrapped track-and-hold circuit to process a sampled signal generated by the first stage;
configuring the Vgs-bootstrapped switch to achieve a high-linearity performance;
configuring the Vgs-bootstrapped switch to be closed when the third stage is in a track mode;
configuring the multi-stage THA to allow the third stage to be in the track mode when the multi-stage THA is in a track state, wherein the Vgs-bootstrapped switch is a low-power switch;
configuring the third stage by coupling multiple track-and-hold circuits in parallel; and
configuring each of the multiple track-and-hold circuits to operate at a fraction of a sampling rate of the first stage.

16. The method of claim 9, further comprising:
configuring the buffer circuit to enable parallel operation of a plurality of multi-stage THAs,
wherein the parallel operation of the plurality of multi-stage THAs facilitates time-interleaving of multiple input signals.

17. A system comprising:
a multi-stage track-and-hold circuit configured to receive an input analog signal and to generate sampled signals; and
an analog-to-digital convertor (ADC) configured to convert the sampled signals to a digital signal,
wherein the multi-stage track-and-hold old circuit comprises:
a first stage configured to receive the input analog signal and configured to sample the input analog signal; and
a second stage coupled to the first stage and including a buffer circuit,
wherein:
the first stage comprises a shunted source-follower circuit and a switched source-follower circuit,
the shunted source-follower circuit comprises a first current source and a first switch,
the switched source-follower circuit comprises a second current source coupled via a second switch to an output node of the switched source-follower circuit, and
the buffer circuit comprises a class-A source follower configured to present a low input-capacitance to the first stage.

18. The system of claim 17, further comprising a third stage coupled to the second stage and including a track-and-hold circuit,
wherein:
the shunted source-follower circuit comprises a first MOS transistor, and the first current source couples a source of the first MOS transistor to a node of a first power supply,
the first MOS transistor comprises a PMOS transistor, when the input analog signal includes a low common-mode voltage,
the first power supply is configured to provide a positive supply voltage, and
a gate node of the first MOS transistor is coupled to the input analog signal and a drain node of the first MOS transistor is coupled to ground potential.

19. The system of claim 18, wherein:
an output node of the shunted source-follower circuit comprises the source of the first MOS transistor,
the first switch comprises a shunt switch and is operable to couple the output node of the shunted source-follower circuit to ground potential, when the first stage is in a hold mode, to provide a reduced hold-mode feed-through and to prevent an input of the second stage from floating,
the first switch is operable to be an open circuit when the first stage is in a track mode, and
the first stage is in the track mode when the multi-stage track-and-hold circuit is in a hold state.

20. The system of claim 18, wherein:
the switched source-follower circuit comprises a second MOS transistor, the second switch, and the second current source,
the second MOS transistor comprises an NMOS transistor where the first MOS transistor is a PMOS transistor,
a gate node of the second MOS transistor is coupled to the output node of the shunted source-follower circuit,
a drain node of the second MOS transistor is coupled to the node of the first power supply,
the second switch is operable to couple a source node of the second MOS transistor to the first current source,
the second current source is coupled to a node of a second power supply, and
the second power supply is configured to provide a negative supply voltage.

\* \* \* \* \*